United States Patent [19]

Ishida et al.

[11] 4,399,324
[45] Aug. 16, 1983

[54] MULTIPLEX DEMODULATION CIRCUIT

[75] Inventors: Kohji Ishida; Tatsuo Numata, both of Tokyo, Japan

[73] Assignee: Pioneer Electronic Corporation, Tokyo, Japan

[21] Appl. No.: 183,783

[22] Filed: Sep. 3, 1980

[30] Foreign Application Priority Data

Sep. 7, 1979 [JP] Japan ................................ 54-114933

[51] Int. Cl.³ ............................................. H04H 5/00
[52] U.S. Cl. .................................. 179/1 GD; 329/167
[58] Field of Search .......... 179/1 GD, 1 GC; 329/50, 329/167

[56] References Cited

U.S. PATENT DOCUMENTS 3,219,759 11/1965 Dome ............................. 179/1 GD

*Primary Examiner*—Douglas W. Olms
*Attorney, Agent, or Firm*—Sughrue, Mion, Zinn, Macpeak & Seas

[57] ABSTRACT

A multiplex demodulation circuit in which no band elimination filter is required for eliminating beating between the mixed signals and odd harmonics of the 38 KHz switching signal derived from the 19 KHz pilot signal. The FM detection signal is logarithmicly converted as is the 38 KHz subcarrier signal. The two logarithmically converted signals are added and then inversely logarithmically converted. The inversely logarithmically converted signal is added to the FM detection signal to produce the left channel signal while the inversely logarithmically converted signal is phase inverted then added to the FM detection signal to provide the right channel signal.

7 Claims, 2 Drawing Figures

MULTIPLEX DEMODULATION CIRCUIT

BACKGROUND OF THE INVENTION

The present invention relates to a multiplex demodulation circuit for use in an FM stereophonic tuner.

A multiplex demodulation circuit operates to separate right and left channel signals from a so-called "composite signal" produced by an FM detector. In such a multiplex demodulation circuit, in general, a 19 KHz pilot signal included in the composite signal is detected to obtain a 38 KHz square wave subcarrier signal and the composite signal is switched by the square wave subcarrier signal to separate and provide the right and left channel signals. Because it is in the form of a square wave as described above, this switching signal includes odd harmonics of 38 KHz. Accordingly, if a signal whose frequency is close to the frequencies of the odd harmonics is mixed in the FM detection output signal, beating occurs between the mixed signal and the odd harmonics of 38 KHz in the switching signal as a result of which unwanted audio components are included in the demodulation output.

In order to overcome this difficulty, a band elimination filter for eliminating the above-described mixed signal is inserted between the FM detector and the multiplex demodulation circuit. However, the use of such a filter adversely affects the level and phase characteristic of the demodulated audio sub signal (L-R) and especially the separation in the high frequency range.

Accordingly, an object of the invention is to provide a multiplex demodulation circuit which provides excellent output characteristics without the use of a band elimination filter which adversely affects the signal response.

SUMMARY OF THE INVENTION

In a multiplex demodulation circuit according to the invention, the FM detection output is subjected to logarithmic conversion to provide a logarithmic conversion output signal. The logarithmic conversion output signal is added to a logarithmic conversion signal of the 18 KHz sinusoidal subcarrier signal to provide an additional output. After the addition output has been subjected to inverse logarithmic conversion to produce an inverse logarithmic conversion output, the normal and phase-inverted output signals from the inverse logarithmic conversion output are separately added to the FM detection output to separate the right and left channel signals from the FM detection output.

DESCRIPTION OF THE PREFERRED EMBODIMENTS

The invention will be described with reference to the accompanying drawings.

Figure 1:
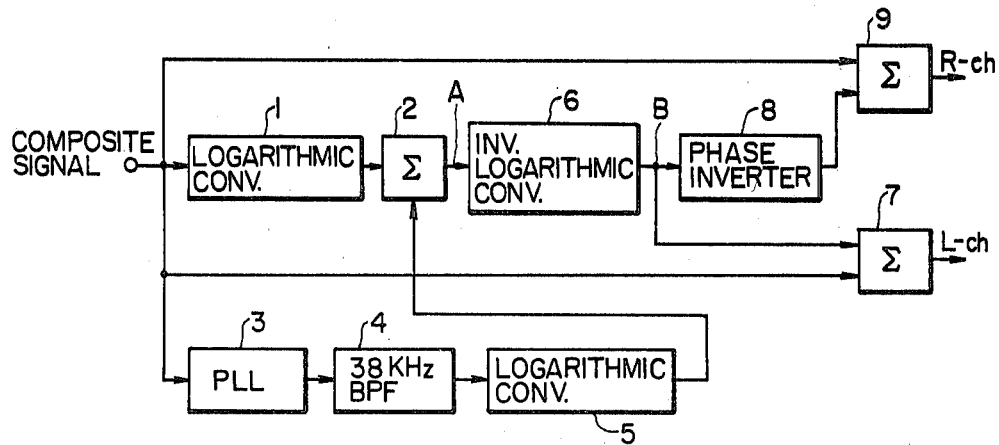
FIG. 1 is a block diagram of a multiplex demodulation circuit of the invention.

FIG. 1 is a block diagram for a description of the principles of operation of the invention. A composite detected FM signal is applied to a first logarithmic converter circuit 1 where it is subjected to logarithmic compression. The output signal of the first logarithmic compression circuit 1 is applied to a first input terminal of an addition circuit 2. A 19 KHz pilot signal component included in the composite signal is detected and a 38 KHz square wave signal synchronized in phase with the pilot signal component thus detected is generated by a PLL (phase-locked loop) circuit 3. The square wave signal thus generated is applied to a 38 KHz BPF (bandpass filter) 4 to obtain a sinusoidal subcarrier signal. The subcarrier signal is applied to a second logarithmic converter circuit 5 where it is subjected to logarithmic compression and is then applied to the second input terminal of the addition circuit 2.

The output of the addition circuit 2 is subjected to inverse logarithmic conversion in an inverse logarithmic converter circuit 6 and is then directly applied to a first input terminal of an addition circuit 7 and through a phase inverter circuit 8 to a first input terminal of an addition circuit 9. The composite signal is applied to the second input terminals of the addition circuits 7 and 9. With this circuit, the L-channel signal and the R-channel signal are separated from the composite signal and are outputted by the addition circuit 9 and the addition circuit 7, respectively.

The FM detection output, the composite signal S(t), can be represented by:

$$S(t) = (L+R) + (L-R)\sin \omega t + P \sin \omega/2 t, \quad (1)$$

where $\omega$ is the angular frequency of the subcarrier signal, L and R are the right and left channel signals, respectively, and P is the amplitude of the pilot signal. The subcarrier signal C(t) passed through the BPF 4 can be expressed by:

$$C(t) = \sin \omega t. \quad (2)$$

Therefore, the output A of the addition circuit 2 is:

$$A(t) = \ln S(t) + \ln C(t) = \ln\{S(t) \cdot C(t)\} \quad (3)$$

The output B of the inverse logarithmic conversion circuit 6 can then be represented by:

$$B(t) = e^{\ln\{S(t) C(t)\}} = S(t) \cdot C(t) \quad (4)$$

$$= (L+R)\sin \omega t + (L-R)\sin 2\omega t + P\sin \frac{\omega}{2} t \sin \omega t$$

$$= \frac{1}{2}(L-R) - \frac{1}{2}(L-R)\cos 2\omega t + (L+R)\sin \omega t +$$

$$P\sin \frac{\omega}{2} t \cdot \sin \omega t$$

It is apparent from the equation (4) that, if only the audio signal components in the output B of the inverse logarithmic conversion circuit 6 are utilized, the level of the sub signal (L-R) is reduced by a factor of one-half. Therefore, if this sub signal is added to the main signal (L+R), which is an audio component of the composite signal, in the addition circuit 7 with the levels of the two signals made equal, the L-channel signal can be separated from the composite signal.

On the other hand, if the opposite phase output of the inverse logarithmic conversion circuit 6 is added to the composite signal in the addition circuit 9, with the levels of the two signals set equal as in the above-described case, the R-channel signal component will be obtained as an audio component.

Figure 2:
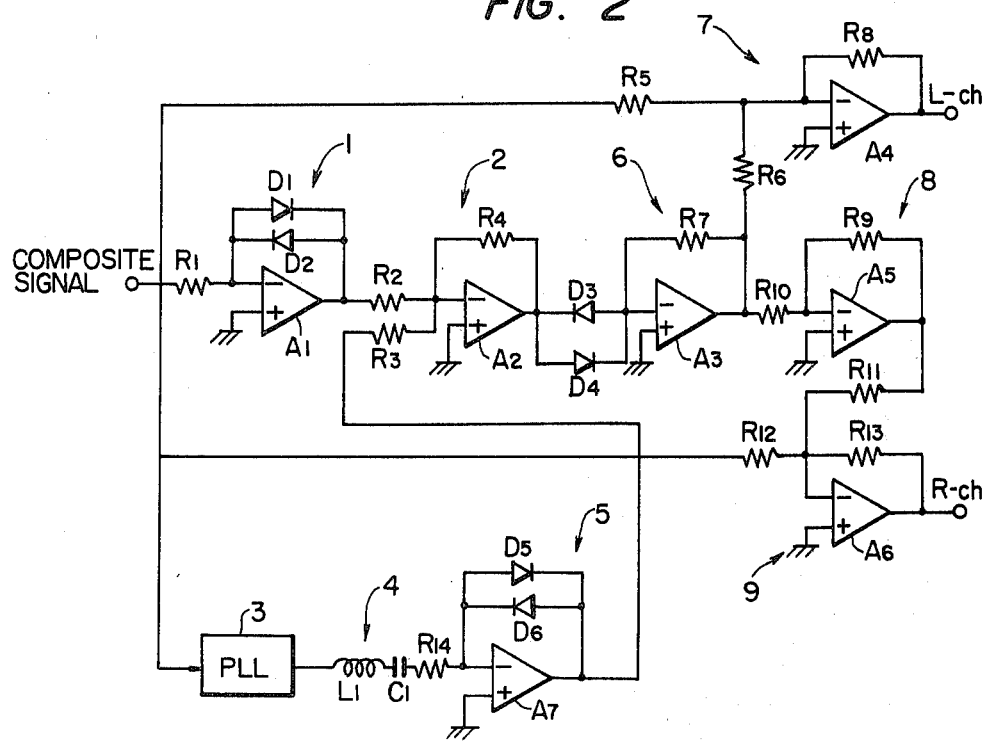
FIG. 2 is a circuit diagram showing specific examples of the circuit elements indicated by blocks in FIG. 1.

FIG. 2 is a circuit diagram showing specific examples of the various circuit elements indicated by the blocks of FIG. 1. Accordingly, in FIG. 2, those components which have been previously described with reference to FIG. 1 are designated by the same reference numerals. The logarithmic converter circuit 1 is made up of an operational amplifier A1, diodes D1 and D2 having a logarithmic conversion characteristic, and an input resistor R1. The addition circuit 2 includes an operational amplifier A2, a feedback resistor R4 and addition resistors R2 and R3. The BPF 4 is a 38 KHz series resonance circuit composed of a coil L1 and a capacitor C1. The second logarithmic converter circuit 5 which subjects the output of the BPF 4 to logarithmic conversion is made up of an operational amplifier A7, logarithmic conversion diodes D5 and D6, and an input resistor 14 similar to the first logarithmic conversion circuit 1.

The inverse logarithmic converter circuit 6 includes an operational amplifier A3, a feedback resistor R7, and inverse logarithmic conversion diodes D3 and D4. The addition circuit 7 is constituted by an operational amplifier A4, a feedback resistor R6, and addition resistors R5 and R6. The phase inverter circuit 8 is made up of an operational amplifier A5, and resistors R9 and R10. The addition circuit 9 is made up of an operational amplifier A6, a feedback resistor R13, and addition resistors R11 and R12.

According to the invention, the logarithmic conversion process is carried out in the demodulation section. Therefore, signal demodulation can be implemented merely with an addition process. Accordingly, a sinusoidal wave sub carrier signal can be employed and in its demodulation output no odd harmonics of 38 KHz are present. Therefore, it is unnecessary to use a band elimination filter for the output of the FM detector and, accordingly, the drawback accompanying a conventional system that separation in the high frequency range is degraded is eliminated.

What is claimed is:

1. A multiplex demodulation circuit comprising:
   first logarithmic conversion means for subjecting an FM detection signal to logarithmic conversion;
   second logarithmic conversion means for subjecting to logarithmic conversion a subcarrier signal produced in response to a pilot signal component in said FM detection signal;
   addition means for adding an output of said first logarithmic conversion means to an output of said second logarithmic conversion means;
   inverse logarithmic conversion means for subjecting an output of said addition means to inverse logarithmic conversion; and
   means for separately adding normal-phase and inverted-phase outputs of said inverse logarithmic conversion means to said FM detection output to separate and provide right and left channels signals.

2. The multiplex demodulation circuit of claim 1 further comprising means for producing said subcarrier signal.

3. The multiplex demodulation circuit of claim 2 wherein said means for producing said subcarrier signal comprises a phase-locked loop having an input coupled to receive said FM detection signal and a band-pass filter having an input coupled to an output of said phase-locked loop and an output coupled to an input of said second logarithmic conversion means.

4. The multiplex demodulation circuit of claim 1 wherein said first and second logarithmic conversion means each comprise an operational amplifier, first and second diodes having a logarithmic conversion characteristic coupled between an output and an inverting input of said operational amplifier in opposite directions, and an input resistor coupled to said inverting input of said operational amplifier.

5. The multiplex demodulation circuit of claim 1 wherein said means for separately adding normal-phase and inverted-phase outputs of said inverse logarithmic conversion means to said FM detection output comprises a first adder circuit having one input coupled to receive said FM detection signal and a second input coupled to an output of said inverse logarithmic conversion means, a phase inverter having an input coupled to said output of said inverse logarithmic conversion means, and a second adder circuit having a first input coupled to receive said FM detection signal and a second input coupled to an output of said second phase inverter.

6. The multiplex demodulation circuit of claim 5 wherein each of said adder circuits comprises an operational amplifier and first and second input resistors each having a first terminal coupled to an inverting input of said operational amplifier.

7. The multiplex demodulation circuit of claim 1 wherein said inverse logarithmic conversion means comprises first and second diodes coupled parallel to one another in opposite directions, one terminal of each of said diodes being coupled to said output of said addition means, and an operational amplifier having an inverting input terminal coupled to second terminals of each of said first and second diodes with a feedback resistor coupled between an output of said operational amplifier and said inverting input terminal.

* * * * *